United States Patent [19]
Okada et al.

[11] Patent Number: 6,133,814
[45] Date of Patent: Oct. 17, 2000

[54] OXIDE SUPERCONDUCTOR WIRE MATERIAL AND METHOD FOR JOINTING THE SAME TOGETHER

[75] Inventors: Michiya Okada, Mito; Keiji Fukushima; Kazuhide Tanaka, both of Hitachi, all of Japan

[73] Assignee: Hitachi, Ltd., Tokyo, Japan

[21] Appl. No.: 08/921,366

[22] Filed: Aug. 29, 1997

[30] Foreign Application Priority Data

Aug. 30, 1996 [JP] Japan .................................. 8-229700

[51] Int. Cl.[7] .............................. H01F 6/06; H01B 12/00
[52] U.S. Cl. ..................... 335/216; 505/879; 505/887; 505/884; 505/100; 174/125.1
[58] Field of Search ..................... 505/100, 220, 505/887, 925, 879, 884; 174/125.1; 335/216

[56] References Cited

U.S. PATENT DOCUMENTS 5,358,929 10/1994 Fujikami et al. ..................... 505/100
5,786,304 7/1998 Kimura et al. ..................... 505/234
5,949,131 9/1999 Sato et al. ..................... 257/662

FOREIGN PATENT DOCUMENTS 5-63247 6/1997 Japan .
9-143000 6/1997 Japan .

*Primary Examiner*—Lincoln Donovan
*Assistant Examiner*—Raymond Barrera
*Attorney, Agent, or Firm*—Antonelli, Terry, Stout & Kraus, LLP

[57] ABSTRACT

Structure for joining together metal-coated multi-core oxide superconductor wire material parts in a tape shape. The C axis of a oxide superconductor crystal is substantially oriented along the longitudinal (length) direction that the wire material extends. The end faces of the wire material parts contact each other at the joint part; and the C face of the oxide superconductor crystal is continuously oriented at the joint part.

21 Claims, 7 Drawing Sheets ized in a

OXIDE SUPERCONDUCTOR WIRE MATERIAL AND METHOD FOR JOINTING THE SAME TOGETHER

BACKGROUND OF THE INVENTION

The present invention relates to an oxide superconductor wire material through which it is required to pass higher current, such as magnet or power transmission cable; a method for producing the wire material and a method for jointing the wire material together. More specifically, the present invention may be applicable widely to oxide superconductor wire materials for use in higher system communication current as high as 100 A or more utilizing the superconducting phenomenon of oxide superconductors, including system structures such as superconducting power transmission cables, bus bars, long conductors, permanent current switch devices, large magnets, nuclear magnetic resonance systems, medical MRI systems, superconducting power reserving systems, magnetic separators, single-crystal drawing-up systems in a magnetic field, freezer cooling superconducting magnets, superconducting energy reservoirs, superconducting generators, nuclear fusion reactor magnets, accelerators, and current leads.

As superconducting materials in practical use, metal superconductors such as NbTi and $Nb_3Sn$ have been known, and the superconductive joint technique for wire materials from these superconductors has been established. As to the technique of jointing oxide superconductors together, alternatively, a variety of methods have been proposed up to now. For example, there have been known
1. Japanese Patent Laid-open No. Hei 1(1989)-24379;
2. Japanese Patent Laid-open No. Hei 1(1989)-17384;
3. Japanese Patent Laid-open No. Hei 3(1991)-242384; and
4. Japanese Patent Laid-open No. Hei 3(1991)-254473.

However, the known jointing methods have the following problems, and therefore, all of them are insufficient. Firstly, the orientation and density of superconductors produced by the methods 1 and 2 are so low, because the joint parts thereof are produced through solid reaction, that a sufficient critical current density is hard to procure.

According to the methods 3 and 4, use is made of Bi-2212 oxides, to produce a dense matrix in orientation by partial melt solidification. Because Bi-2212 crystal is produced by melting the oxide and then crystallizing the resulting oxide, a larger oriented crystal grows, advantageously for superconductive joints. For crystallization from the melted state, a method comprising inserting an intervening substance is generally selected. According to the method 3, for example, a precursor or a calcined body in powder, is arranged as the intervening substance in the joint part, followed by thermal treatment in the atmosphere. According to the method, however, the thermal treatment temperatures for the oxide superconductors and the calcined powder are different under some conditions because their melt temperatures are different by about 10 degrees, so good jointing can be attained only with much difficulty. If the intervening substance is singly melted, the crystal growing in a liquid phase is hardly connected satisfactorily to Bi-2212 as a connecting matter.

In recent years, thus, a method comprising integrating together such intervening substance and a connecting matter and then crystallizing the resulting integrated substance, has been investigated. According to the method 4, for example, an oxide superconductor primarily containing Bi-2212 is partially melted under heating at a state such that a calcined oxide powder with the same composition as a calcined substance is interposed at a part of the region of jointing together the oxide semiconductors. According to the method, however, the melt temperature readily varies depending on the ratio of the calcined powder mixed to the Bi-2212 phase; and the composition is assumed to be a single-core wire material. Thus, attention has not been paid to a method for jointing together a multi-core wire material, which is now under rapid technical development. For example, a high-performance tape wire material recently developed through energetic investigations by the present inventors is currently one of the wire materials with the highest critical current, among oxide superconductor wire materials. Details thereof are described for example in Japanese Journal of Applied Physics, vol. 34, page 4770–4773, 1995. For jointing a 55-core wire material of a representative tape thickness and shape, for example a thickness of 0.1 mm and a tape width of 5 mm, the superconductor therefor should comprise a single Bi-2212 phase and should have a superconductor core thickness of about 5 to 10 microns. Therefore, practically, it is very difficult to conduct the procedure of uniformly inserting intervening substances in the individual cores, as in the invention of 4, and additionally, no satisfactory performance is brought about, disadvantageously, if a Bi-2212 phase containing a calcined substance is used as the filling powder. Because the crystal nucleus is readily generated, starting from the intervening substance as the starting point, in such multicore wire materials during melt solidification, furthermore, crystal orientation is reduced at the joint part with addition of an intervening substance, compared with the orientation within the wire material, leading to the reduction of Jc at the joint part, disadvantageously. Such phenomenon is a specific phenomenon for jointing via melt solidification using a multi-core wire material in particular. The reason resides in that the multi-core wire material has a cross-sectional structure such that the silver and the superconductor are alternately laminated to each other, while the layer of the intervening substance does not have such multi-core structure.

SUMMARY OF THE INVENTION

The present invention has been attained in such circumstances, and the object is to provide a novel superconductive joint structure capable of realizing a good superconductive joint state of an oxide superconductive tape wire material of a multi-core structure; and a method for fabricating the structure.

The above object is attained by a metal-coated multi-core oxide superconductor wire material of a flat cross-sectional shape, wherein the C axis of the oxide superconductor crystal is substantially oriented in the longitudinal direction of the wire material; and the end faces of the adjacent wire materials in the longitudinal direction are in contact with each other at the joint part of the wire material and the C face of the oxide superconductor crystal is continuously oriented at the joint part of the wire material. Additionally, the use of intervening substances and the like is not essentially required, but it is allowed to add an extreme trace amount of an auxiliary agent capable of promoting crystal growth on the joint end face, for example silver, into the joint part within a range such that the joint structure of the present invention can be maintained. In accordance with the present invention, furthermore, an oxide powder synthesized in a single phase is used as the oxide superconductor powder to be filled in the wire material.

Furthermore, the above object is attained by a long multi-core superconducting wire material with a superconductive joint part, wherein the critical current density is 1000 $A/mm^2$ or more and the critical current is 100 A or more, at the joint part.

Still furthermore, the above object is attained by an oxide superconductor wire material, wherein the oxide superconductor wire material is of a tape shape and the end face of the tape is perpendicular to the longitudinal direction if observed from the upper face of the tape.

And further, the above object is attained by the superconductive joint structure, wherein the oxide superconductor wire material is of a tape shape and the end face of the tape is at a angle to the longitudinal direction if observed from the upper face of the tape.

Additionally, the above object is attained by the superconductive joint structure, wherein the oxide superconductor wire material is of a tape shape and the end face of the tape is at an angle to the longitudinal direction if observed from the side face of the tape.

Still additionally, the above object is attained by the superconductive joint structure, wherein the oxide superconductor wire material is of a tape shape and the end face of the tape is at an angle to the longitudinal direction if observed from the side and upper faces of the tape.

Further, the above object is attained by the superconductive joint structure, wherein the thickness of the element wire of the oxide superconductor wire material is 0.1 mm to 0.3 mm.

Still yet further, the above object is attained by the superconductive joint structure, wherein the metal coating material of the oxide superconductor wire material is silver or silver-gold alloy or an alloy produced by finely dispersing magnesium, nickel, aluminum or oxides of two or more thereof in the mother material.

Additionally, the above object is attained by the superconductive joint structure, wherein the oxide superconductor is of a $Bi_2Sr_2Ca_2Cu_1O_x$ phase.

Still additionally, the above object is attained by the superconductive jointing, comprising a process of fabricating oxide superconductor wire materials, a process for arranging the ends of the wire material in contact to each other, and a process of partially melting the wire materials and the joint part, wherein a plurality of the superconductor filaments in crystal are put in contact to each other by thermal treatment, whereby the crystal is continuously jointed together in a superconducting manner.

Then, the above object is attained by a method for jointing together oxide superconductor wire materials each of a cross-sectional structure comprising a bundle of a plurality of oxide superconductor tapes, wherein the individual tape wire materials are laminated together in a layer by using the tape faces, and the individual layers are jointed together and the joint parts are arranged so that the joint parts might not overlap the positions of the joint parts of the upper and lower tape wire materials.

Furthermore, the above object is attained by defining one coating material of the wire material composing the joint as silver and the other coating material of the wire material as silver-gold alloy, wherein the melt temperatures of the different coating materials on the oxide superconductor wire material are made almost equal by adding 0.01% to 10% by weight of silver into at least the superconductor coated with the silver-gold alloy.

DESCRIPTION OF THE PREFERRED EMBODIMENTS

Figure 1:
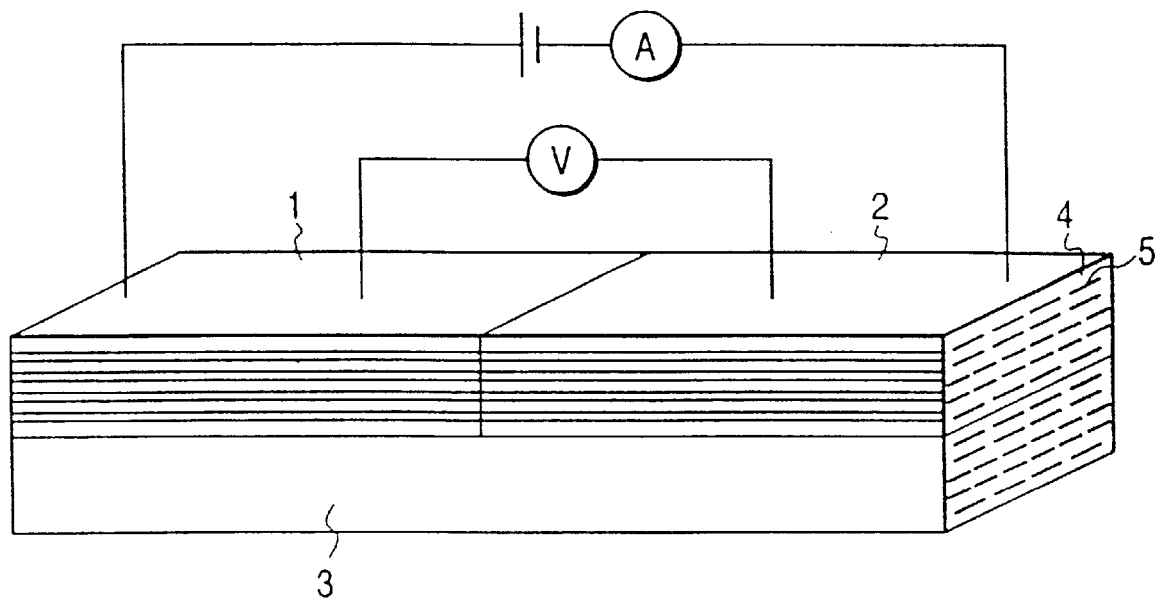
FIG. 1 is a schematic view of an oxide superconductor wire material of the present invention.

Since the discovery of oxide superconductors, active research works have been carried out toward the preparation thereof into wire materials and the application thereof to power appliances. Compared with conventional superconductors, oxide superconductors characteristically have a far higher superconducting transition temperature (abbreviated as "Tc" hereinbelow) and a far higher upper critical magnetic field (abbreviated as "$Hc_2$" hereinbelow), and therefore, the application of the superconductors has been expected in a variety of fields. Bi superconductors have been known, including for example $Bi_2Sr_2Ca_1Cu_2O_x$ (abbreviated as "Bi-2212" hereinbelow) with Tc of about 85 K and $(Bi, Pb)_2Sr_2Ca_2Cu_3O_x$ (abbreviated as "Bi-2223" hereinbelow) with Tc of about 105 K. The application thereof as a conductor with a higher capacity to electric appliances is promising.

Attempts have been made to produce superconducting magnets or cables by filling these oxide superconductors in silver pipes and thereafter processing these superconductors in tape shapes to wind up these superconductors in a coil form for thermal treatment or to thermally treat these superconductors and thereafter wind up them in a coil form. Such research works have been carried out actively.

For producing the tape wire material with the silver sheath described above by using the Bi-2212 superconductor, generally, the following methods have been employed. Firstly, powdery Bi-2212 is prepared preliminarily; then, the Bi-2212 is filled in a silver pipe, which is processed into a dense tape shape. Subsequently, subjecting the Bi-2212 to partial melt processing under heating while raising the temperature, a superior dense tape wire material in orientation is produced under annealing.

As to Bi-2223 wire materials, alternatively, the powder thereof is filled in a silver pipe and is then subjected to thermal treatment and processing in repetition, to produce a dense and oriented crystal matrix. Because the reaction to form a Bi-2223 phase generally proceeds as a solid reaction, in this case, the resulting crystal diameter is small compared with that of the Bi-2212 system, and additionally, the crystal includes a great number of anisotropic phases. consequently, the crystal matrix has a slightly lower critical current density (abbreviated as "Jc" hereinbelow), compared with those of the Bi-2212 wire materials.

In the case of applying superconductors to applications requiring an extremely stable magnetic field in a short term, such as a nuclear magnetic resonance analyzer (abbreviated as "NMR" hereinafter), for example, superconductive jointing is essential and the attenuation of superconductive current is largely influenced by whether or not the superconductive jointing is great. For those requiring an extremely long conductor length, such as transmission cable, the energy loss at the joints to the whole energy loss in the whole system should be reduced as much as possible; otherwise, the system cannot be established in some cases. The performance of a large-scale superconducting magnet with a joint part within the coil is poor, so the performance of the coil will eventually be deteriorated due to exothermic heat. Thus, it is very significant to attain a good jointing state in a superconductive fashion.

The superconductive joint method of the present invention may be applicable widely to superconducting appliances, for example, superconducting transmission cables, bus bars, long conductors, permanent current switch devices, large-scale magnets, nuclear magnetic resonance systems, medicinal MRI systems, superconducting power reserving systems, magnetic separation units, single-crystal drawing-out systems in magnetic fields, freezer cooling superconducting magnet systems and the like.

In the oxide superconductor wire material, the oxide superconductor is preferably of a series of Bi-2212; however, a wide variety of oxide superconductors may be usable, including for one example Bi-2223 or thallium superconductors, such as those superconductor materials described below;

Tl—Ba—Ca—Cu—O series $Tl_{1.5-2.2}$—$Ba_{1.5-2.2}$—$Cu_{0.5-1.3}$—$O_{5-7}$ $Tl_{1.5-1.2}$—$Ba_{1.5-2.2}$—$Ca_{0.5-1.3}$—$Cu_{1.5-2.3}$—$O_{7-9}$ $Tl_{1.5-2.2}$—$Ba_{1.5-2.3}$—$Ca_{1.5-2.3}$—$Cu_{2.5-3.3}$—$O_{9-11}$ $Tl_{0.5-1.2}$—$Ba_{1.5-2.2}$—$Cu_{0.5-1.3}$—$O_{4-6}$ $Tl_{0.5-1.2}$—$Ba_{1.5-2.2}$—$Ca_{0.5-1.2}$—$Cu_{1.5-2.3}$—$O_{6-8}$ $Tl_{0.5-1.2}$—$Ba_{1.5-2.2}$—$Ca_{2.5-3.2}$—$Cu_{3.5-4.3}$—$O_{8-10}$ Tl—Sr—Ca—Cu—O series $Tl_{1.5-2.2}$—$Sr_{1.5-2.2}$—$Cu_{0.5-1.3}$—$O_{5-7}$ $Tl_{1.5-1.2}$—$Sr_{1.5-2.2}$—$Ca_{0.5-1.3}$—$Cu_{1.5-2.3}$—$O_{7-9}$ $Tl_{1.5-2.2}$—$Sr_{1.5-2.3}$—$Ca_{1.5-2.3}$—$Cu_{2.5-3.3}$—$O_{9-11}$ $Tl_{0.5-1.2}$—$Sr_{1.5-2.2}$—$Cu_{0.5-1.3}$—$O_{4-6}$ $Tl_{0.5-1.2}$—$Sr_{1.5-2.2}$—$Ca_{0.5-1.2}$—$Cu_{1.5-2.3}$—$O_{6-8}$ $Tl_{0.5-1.2}$—$Sr_{1.5-2.2}$—$Ca_{2.5-3.2}$—$Cu_{3.5-4.3}$—$O_{8-10}$ Tl—Ba—Sr—Ca—Cu—O series $Tl_{1.5-2.2}$—$(Ba_x$—$Sr_{1-x})_{1.5-2.2}$—$Cu_{0.5-1.3}$—$O_{5-7}$ $Tl_{1.5-1.2}$—$(Ba_x$—$Sr_{1-x})_{1.5-2.2}$—$Ca_{0.5-1.3}$—$Cu_{1.5-2.3}$—$O_{7-9}$ -continued $Tl_{1.5-2.2}$—$(Ba_x$—$Sr_{1-x})_{1.5-2.3}$—$Ca_{1.5-2.3}$—$Cu_{2.5-3.3}$—$O_{9-11}$ $Tl_{0.5-1.2}$—$(Ba_x$—$Sr_{1-x})_{1.5-2.2}$—$Cu_{0.5-1.3}$—$O_{4-6}$ $Tl_{0.5-1.2}$—$(Ba_x$—$Sr_{1-x})_{1.5-2.2}$—$Ca_{0.5-1.2}$—$Cu_{1.5-2.3}$—$O_{6-8}$ $Tl_{0.5-1.2}$—$(Ba_x$—$Sr_{1-x})_{1.5-2.2}$—$Ca_{2.5-3.2}$—$Cu_{3.5-4.3}$—$O_{8-10}$ x = 0.1 ~ 0.9

Tl—Pb—Sr—Ca—Cu—O series $(Tl_y$—$Pb_{1-y})_{1.5-2.2}$—$Sr_{1.5-2.2}$—$Cu_{0.5-1.3}$—$O_{5-7}$ $(Tl_y$—$Pb_{1-y})_{1.5-1.2}$—$Sr_{1.5-2.2}$—$Ca_{0.5-1.3}$—$Cu_{1.5-2.3}$—$O_{7-9}$ $(Tl_y$—$Pb_{1-y})_{1.5-2.2}$—$Sr_{1.5-2.3}$—$Ca_{1.5-2.3}$—$Cu_{2.5-3.3}$—$O_{9-11}$ $(Tl_y$—$Pb_{1-y})_{0.5-1.2}$—$Sr_{1.5-2.2}$—$Cu_{0.5-1.3}$—$O_{4-6}$ $(Tl_y$—$Pb_{1-y})_{0.5-1.2}$—$Sr_{1.5-2.2}$—$Ca_{0.5-1.2}$—$Cu_{1.5-2.3}$—$O_{6-8}$ $(Tl_y$—$Pb_{1-y})_{1.5-1.2}$—$Sr_{1.5-2.2}$—$Ca_{2.5-3.2}$—$Cu_{3.5-4.3}$—$O_{8-10}$ y = 0.1 ~ 0.9

Tl—Pb—Ba—Sr—Ca—Cu—O series $(Tl_y$—$Pb_{1-y})_{1.5-2.2}$—$(Ba_x$—$Sr_{1-x})_{1.5-2.2}$—$Cu_{0.5-1.3}$—$O_{5-7}$ $(Tl_y$—$Pb_{1-y})_{1.5-1.2}$—$(Ba_x$—$Sr_{1-x})_{1.5-2.2}$—$Ca_{0.5-1.3}$—$Cu_{1.5-2.3}$—$O_{7-9}$ $(Tl_y$—$Pb_{1-y})_{1.5-2.2}$—$(Ba_x$—$Sr_{1-x})_{1.5-2.3}$—$Ca_{1.5-2.3}$—$Cu_{2.5-3.3}$—$O_{9-11}$ $(Tl_y$—$Pb_{1-y})_{0.5-1.2}$—$(Ba_x$—$Sr_{1-x})_{1.5-2.2}$—$Cu_{0.5-1.3}$—$O_{4-6}$ $(Tl_y$—$Pb_{1-y})_{0.5-1.2}$—$(Ba_x$—$Sr_{1-x})_{1.5-2.2}$—$Ca_{0.5-1.2}$—$Cu_{1.5-2.3}$—$O_{6-8}$ $(Tl_y$—$Pb_{1-y})_{0.5-1.2}$—$(Ba_x$—$Sr_{1-x})_{1.5-2.2}$—$Ca_{2.5-3.2}$—$Cu_{3.5-4.3}$—$O_{8-10}$ x = 0.1 ~ 0.9   y = 0.1 ~ 0.9

Bi—Sr—Ca—Cu—O series $Bi_{1.5-2.2}$—$Sr_{1.5-2.2}$—$Cu_{0.5-1.3}$—$O_{5-7}$ $Bi_{1.5-1.2}$—$Sr_{1.5-2.2}$—$Ca_{0.5-1.3}$—$Cu_{1.5-2.3}$—$O_{7-9}$ $Bi_{1.5-2.2}$—$Sr_{1.5-2.3}$—$Ca_{1.5-2.3}$—$Cu_{2.5-3.3}$—$O_{9-11}$ Bi—Pb—Sr—Ca—Cu—O series $(Bi_y$—$Pb_{1-y})_{1.5-2.2}$—$Sr_{1.5-2.2}$—$Cu_{0.5-1.3}$—$O_{5-7}$ $(Bi_y$—$Pb_{1-y})_{1.5-1.2}$—$Sr_{1.5-2.2}$—$Ca_{0.5-1.3}$—$Cu_{1.5-2.3}$—$O_{7-9}$ $(Bi_y$—$Pb_{1-y})_{1.5-2.2}$—$Sr_{1.5-2.3}$—$Ca_{1.5-2.3}$—$Cu_{2.5-3.3}$—$O_{9-11}$ y = 0.1 ~ 0.9

Ln—Ba—Cu—O series $Ln_{1.5-2.3}$—$Cu_{0.5-1.3}$—$O_{4-6}$ $Ln_{0.5-1.3}$—$Ba_{1.5-2.3}$—$Cu_{2.5-3.3}$—$O_{6-8}$ Ln : Y, Sc, La, Ac, Ce, Pr, Nd, Pm, Sm, Eu, Gd, Tb, Dy, Ho, Er, Tm, Yb, Lu Ln—Sr—Cu—O series $Ln_{0.5-1.3}$—$Sr_{1.5-2.3}Cu_{2.5-3.3}$—$O_{6-8}$ Ln : Y, Sc, La, Ac, Ce, Pr, Nd, Pm, Sm, Eu, Gd, Tb, Dy, Ho, Er, Tm, Yb, Lu Bi—Sr—Y—Cu—O series $(Bi_{1-x}Cu_x)$—$Sr_2$—$(Y_{1-y}Cu_y)$—$Cu_2$—$O_{6-8}$ x = 0.1 ~ 0.9   y = 0.1 ~ 0.9

Ba—Ca—Cu—O  series $Cu_{0.5-1.2}$—$Ba_{1.5-2.2}$—$Cu_{0.5-1.3}$—$O_{4-6}$

-continued $Cu_{0.5-1.2}$—$Ba_{1.5-2.2}$—$Ca_{0.5-1.2}$—$Cu_{1.5-2.3}$—$O_{6-8}$ $Cu_{0.5-1.2}$—$Ba_{1.5-2.2}$—$Ca_{2.5-3.2}$—$Cu_{3.5-4.3}$—$O_{8-10}$ $(Ag_x{'}Cu_{1-x})_{0.5-1.2}$—$Ba_{1.5-2.2}$—$Cu_{0.5-1.3}$—$O_{4-6}$ $(Ag_x{'}Cu_{1-x})_{0.5-1.2}$—$Ba_{1.5-2.2}$—$Ca_{0.5-1.2}$—$Cu_{1.5-2.3}$—$O_{6-8}$ $(Ag_x{'}Cu_{1-x})_{0.5-1.2}$—$Ba_{1.5-2.2}$—$Ca_{2.5-3.2}$—$Cu_{3.5-4.3}$—$O_{8-10}$ $x = 0 \sim 1$ Sr—Ca—Cu—O series $Cu_{0.5-1.2}$—$Sr_{1.5-2.2}$—$Cu_{0.5-1.3}$—$O_{4-6}$ $Cu_{0.5-1.2}$—$Sr_{1.5-2.2}$—$Ca_{0.5-1.2}$—$Cu_{1.5-2.3}$—$O_{6-8}$ $Cu_{0.5-1.2}$—$Sr_{1.5-2.2}$—$Ca_{2.5-3.2}$—$Cu_{3.5-4.3}$—$O_{8-10}$ $(Ag_x{'}Cu_{1-x})_{0.5-1.2}$—$Sr_{1.5-2.2}$—$Cu_{0.5-1.3}$—$O_{4-6}$ $(Ag_x{'}Cu_{1-x})_{0.5-1.2}$—$Sr_{1.5-2.2}$—$Ca_{0.5-1.2}$—$Cu_{1.5-2.3}$—$O_{6-8}$ $(Ag_x{'}Cu_{1-x})_{0.5-1.2}$—$Sr_{1.5-2.2}$—$Ca_{2.5-3.2}$—$Cu_{3.5-4.3}$—$O_{8-10}$ $x = 0 \sim 1$ Hg—Ba—Ca—Cu—O series $Hg_{1.5-2.2}$—$Ba_{1.5-2.2}$—$Cu_{0.5-1.3}$—$O_{5-7}$ $Hg_{1.5-1.2}$—$Ba_{1.5-2.2}$—$Ca_{0.5-1.3}$—$Cu_{1.5-2.3}$—$O_{7-9}$ $Hg_{1.5-2.2}$—$Ba_{1.5-2.3}$—$Ca_{1.5-2.3}$—$Cu_{2.5-3.3}$—$O_{9-11}$ $Hg_{0.5-1.2}$—$Ba_{1.5-2.2}$—$Cu_{0.5-1.3}$—$O_{4-6}$ $Hg_{0.5-1.2}$—$Ba_{1.5-2.2}$—$Ca_{0.5-1.2}$—$Cu_{1.5-2.3}$—$O_{6-8}$ $Hg_{0.5-1.2}$—$Ba_{1.5-2.2}$—$Ca_{2.5-3.2}$—$Cu_{3.5-4.3}$—$O_{8-10}$ Hg—Sr—Ca—Cu—O series $Hg_{1.5-2.2}$—$Sr_{1.5-2.2}$—$Cu_{0.5-1.3}$—$O_{5-7}$ $Hg_{1.5-1.2}$—$Sr_{1.5-2.2}$—$Ca_{0.5-1.3}$—$Cu_{1.5-2.3}$—$O_{7-9}$ $Hg_{1.5-2.2}$—$Sr_{1.5-2.3}$—$Ca_{1.5-2.3}$—$Cu_{2.5-3.3}$—$O_{9-11}$ $Hg_{0.5-1.2}$—$Sr_{1.5-2.2}$—$Cu_{0.5-1.3}$—$O_{4-6}$ $Hg_{0.5-1.2}$—$Sr_{1.5-2.2}$—$Ca_{0.5-1.2}$—$Cu_{1.5-2.3}$—$O_{6-8}$ $Hg_{0.5-1.2}$—$Sr_{1.5-2.2}$—$Ca_{2.5-3.2}$—$Cu_{3.5-4.3}$—$O_{8-10}$ Hg—Ba—Sr—Ca—Cu—O series $Hg_{1.5-2.2}$—$(Ba_x$—$Sr_{1-x})_{1.5-2.2}$—$Cu_{0.5-1.3}$—$O_{5-7}$ $Hg_{1.5-1.2}$—$(Ba_x$—$Sr_{1-x})_{1.5-2.2}$—$Ca_{0.5-1.3}$—$Cu_{1.5-2.3}$—$O_{7-9}$ $Hg_{1.5-2.2}$—$(Ba_x$—$Sr_{1-x})_{1.5-2.3}$—$Ca_{1.5-2.3}$—$Cu_{2.5-3.3}$—$O_{9-11}$ $Hg_{0.5-1.2}$—$(Ba_x$—$Sr_{1-x})_{1.5-2.2}$—$Cu_{0.5-1.3}$—$O_{4-6}$ $Hg_{0.5-1.2}$—$(Ba_x$—$Sr_{1-x})_{1.5-2.2}$—$Ca_{0.5-1.2}$—$Cu_{1.5-2.3}$—$O_{6-8}$ $Hg_{0.5-1.2}$—$(Ba_x$—$Sr_{1-x})_{1.5-2.2}$—$Ca_{2.5-3.2}$—$Cu_{3.5-4.3}$—$O_{8-10}$ $x = 0.1 \sim 0.9$ Hg—Pb—Sr—Ca—Cu—O series $(Hg_y$—$Pb_{1-y})_{1.5-2.2}$—$Sr_{1.5-2.2}$—$Cu_{0.5-1.3}$—$O_{5-7}$ $(Hg_y$—$Pb_{1-y})_{1.5-1.2}$—$Sr_{1.5-2.2}$—$Ca_{0.5-1.3}$—$Cu_{1.5-2.3}$—$O_{7-9}$ $(Hg_y$—$Pb_{1-y})_{1.5-2.2}$—$Sr_{1.5-2.3}$—$Ca_{1.5-2.3}$—$Cu_{2.5-3.3}$—$O_{9-11}$ $(Hg_y$—$Pb_{1-y})_{0.5-1.2}$—$Sr_{1.5-2.2}$—$Cu_{0.5-1.3}$—$O_{4-6}$ $(Hg_y$—$Pb_{1-y})_{0.5-1.2}$—$Sr_{1.5-2.2}$—$Ca_{0.5-1.2}$—$Cu_{1.5-2.3}$—$O_{6-8}$ $(Hg_y$—$Pb_{1-y})_{0.5-1.2}$—$Sr_{1.5-2.2}$—$Ca_{2.5-3.2}$—$Cu_{3.5-4.3}$—$O_{8-10}$ $y = 0.1 \sim 0.9$ Hg—Pb—Ba—Sr—Ca—Cu—O series $(Hg_y$—$Pb_{1-y})_{1.5-2.2}$—$(Ba_x$—$Sr_{1-x})_{1.5-2.2}$—$Cu_{0.5-1.3}$—$O_{5-7}$ $(Hg_y$—$Pb_{1-y})_{1.5-1.2}$—$(Ba_x$—$Sr_{1-x})_{1.5-2.2}$—$Ca_{0.5-1.3}$—$Cu_{1.5-2.3}$—$O_{7-9}$ $(Hg_y$—$Pb_{1-y})_{1.5-2.2}$—$(Ba_x$—$Sr_{1-x})_{1.5-2.3}$—$Ca_{1.5-2.3}$—$Cu_{2.5-3.3}$—$O_{9-11}$ $(Hg_y$—$Pb_{1-y})_{0.5-1.2}$—$(Ba_x$—$Sr_{1-x})_{1.5-2.2}$—$Cu_{0.5-1.3}$—$O_{4-6}$ $(Hg_y$—$Pb_{1-y})_{0.5-1.2}$—$(Ba_x$—$Sr_{1-x})_{1.5-2.2}$—$Ca_{0.5-1.2}$—$Cu_{1.5-2.3}$—$O_{6-8}$ $(Hg_y$—$Pb_{1-y})_{0.5-1.2}$—$(Ba_x$—$Sr_{1-x})_{1.5-2.2}$—$Ca_{2.5-3.2}$—$Cu_{3.5-4.3}$—$O_{8-10}$ $x = 0.1 \sim 0.9$    $y = 0.1 \sim 0.9$ Hg—Tl—Ba—Ca—O series $(Hg_y$—$Tl_{1-y})_{1.5-2.2}$—$(Ba_x$—$Sr_{1-x})_{1.5-2.2}$—$Cu_{0.5-1.3}$—$O_{5-7}$ $(Hg_y$—$Tl_{1-y})_{1.5-1.2}$—$(Ba_x$—$Sr_{1-x})_{1.5-2.2}$—$Ca_{0.5-1.3}$—$Cu_{1.5-2.3}$—$O_{7-9}$ $(Hg_y$—$Tl_{1-y})_{1.5-2.2}$—$(Ba_x$—$Sr_{1-x})_{1.5-2.3}$—$Ca_{1.5-2.3}$—$Cu_{2.5-3.3}$—$O_{9-11}$ $(Hg_y$—$Tl_{1-y})_{0.5-1.2}$—$(Ba_x$—$Sr_{1-x})_{1.5-2.2}$—$Cu_{0.5-1.3}$—$O_{4-6}$ $(Hg_y$—$Tl_{1-y})_{0.5-1.2}$—$(Ba_x$—$Sr_{1-x})_{1.5-2.2}$—$Ca_{0.5-1.2}$—$Cu_{1.5-2.3}$—$O_{6-8}$ $(Hg_y$—$Tl_{1-y})_{0.5-1.2}$—$(Ba_x$—$Sr_{1-x})_{1.5-2.2}$—$Ca_{2.5-3.2}$—$Cu_{3.5-4.3}$—$O_{8-10}$ $x = 0 \sim 1$    $y = 0.1 \sim 0.9$ Additionally, the tensile strength of the oxide superconductor wire material may be elevated approximately by 3-fold when the metal coating material is silver or gold or an alloy comprising one or two or more thereof as the mother material; or silver or gold alloy containing a trace amount of magnesium, titanium, nickel and copper as an additive, whereby the metal coating material can procure the function to increase the mechanical strength of the wire material.

A method for manufacturing a superconducting magnet with the oxide superconductive joint, comprising thermal treatment following the process of coil winding including the joint part, can practically produce a wire material capable of retaining a superconducting profile over the long length with no local mechanical distortion, to achieve a permanent current magnet.

For the purpose of applying oxide superconductors to electric appliances, the present inventors have conventionally poured their energy mainly in improving the current passing properties of wire materials. Consequently, the inventors have developed a technique to provide a wire material with a critical current density as high as 1800 A/mm$^2$ in a 30-T outer magnetic field by using a Bi-2212 wire material with 19-55 cores. Even if attempts were made of jointing the wire material by conventionally known methods, however, a great number of problems occurred, with the decrease of the critical current density by one order or so at the joint part. Thus, no excellent properties of such wire material could be retained at the joint parts. Thus, the present inventors have continued investigations, to find a method for jointing superconducting wire materials to each other with no deterioration of the essential current passing properties of such high-performance multi-core tape wire material, as collectively shown herein.

In accordance with the present invention, a multi-core oxide superconductor wire material is of a flat cross-sectional shape and is metal-coated; and in the joint structure, the C axis of the oxide superconductor crystal is substantially oriented in the longitudinal direction of the wire material; and the end faces of the wire materials in the longitudinal direction are in contact to each other at the joint part of the wire material and the C face of the oxide superconductor crystal is continuously oriented at the joint part of the wire material. Through such specific joint structure, a superconductive joint can be realized with no substantial deterioration of the critical current of the multi-core wire material with extremely great performance with a critical current density of 1800 A/mm$^2$ at 30. It was experimentally verified that the critical current density in the long multi-core oxide superconductor with such superconductive joint part was about 1000 A/mm$^2$ or more. By further improvement of the properties of the wire material of itself in future, the density will be increased possibly. It was confirmed experimentally that the critical current confirmed was about 100 A or more at the current level and that most of the current was extremely high, as much as 300 A or more.

The present inventors have examined the macroscopic geometric structure of the joint part, and consequently, the inventors have found that good critical current properties can readily be realized when the wire material is of a tape shape and the end face of the tape is arranged vertical to the longitudinal direction if observed from the tape upper face. The inventors have found that by arranging the tape end face at an angle to the longitudinal direction if observed from the tape upper face in the superconductive joint part provided that the wire material is of a tape shape, the deterioration thereof by thermal distortion and mechanical distortion can be prevented, with the resultant marked effects on the life and reliability of the joint part. The inventors have found that the same effects may also be brought about when the wire material is of a tape shape and the tape end face is arranged at an angle to the longitudinal direction if observed from the tape side face in the superconductive joint structure or when the wire material is of a tape shape and the tape end face is arranged at an angle to the longitudinal direction if observed from the tape side face and tape upper face.

As to the shape of the high-performance wire material developed by the present inventors, the thickness of the elemental wire is about 0.1 mm or more to 0.3 mm or less. Thus, the thickness of the individual joint members agrees with the tape thickness used in the experiments, within the range experimentally verified by the present inventors. Therefore, it should be described additionally that experimental verification cannot be obtained outside the range, but the present invention is not limited to the range.

Still more additionally, the present inventors have found that the overall strength of the superconductive joint structure can be improved by defining the metal coating material of the wire material as silver or silver-gold alloy or an alloy produced by finely dispersing magnesium, nickel, aluminum or oxides of two or more thereof into silver or silver-gold alloy as the mother material.

The present inventors have found still furthermore that in the superconductive joint structure, preferably, the oxide isuperconductor primarily may be of a $Bi_2Sr_2Ca_2Cu_1O_x$ phase.

The present inventors have demonstrated additionally that by the method for jointing together the oxide superconductor tape, comprising a process of fabricating oxide superconductor wire materials, a process of arranging respective ends of the wire material in contact with each other, and a process of partially melting the wire material and the joint part, wherein a plurality of the superconductor filaments in crystal are put in contact with each other by thermal treatment, whereby the crystal is continuously jointed together in a superconducting manner, a metal-coated multi-core oxide superconductor wire material of a flat cross-sectional shape can be produced, wherein the C axis of the oxide superconductor crystal is substantially oriented in the longitudinal direction of the wire material; and the end faces of the wire materials in the longitudinal direction are in contact with each other at the joint part of the wire material and the C face of the oxide superconductor crystal is continuously oriented, at the joint part of the wire material.

Additionally, by a method for jointing together an oxide superconductor of a cross-sectional structure comprising a bundle of a plurality of the oxide superconductor tapes utilizing such jointing method, the individual tape wire materials are laminated together in a layer by using the tape faces, and the individual layers are jointed together to arrange the joint parts by utilizing the superconductive joint method in such a fashion that the joint parts might not overlap the positions of the joint parts of the upper and lower tape wire materials.

The present inventors have found that when the partial melt temperatures of the sheath materials in a superconductive phase are different due to the difference in the sheath materials, as in one illustrative case when one coating material of a wire material composing a joint is silver and the other coating material of the wire material composing the joint is an alloy of silver-10% gold, the melt temperature of the oxide superconductor coated with the silver-gold alloy can be reduced to about the same temperature of the silver coating materials through addition of silver at 0.01% or more to 10% or less, preferably 0.1% or more to 1% or less and most preferably 0.3% to 0.7% into the superconductor coated with the silver-gold alloy with a higher melt temperature, so that the influence of the difference (in melt temperature) can be reduced to a negligible level. Thus, the inventors have found that the superconductive jointing of the multi-core wire material with such different sheath materials can be realized, very effectively.

Alternatively, a liquid phase is generated during partial melting. Because the liquid leaks from the joint part, however, the critical current density at the joint part may be lowered or short circuiting may occur between the adjacent tape wire materials wound around in a coil form, which eventually will reduce the intensity of a developed magnetic field. In accordance with the present invention, however, calcined bodies or the like won't be used as intervening substances at the joint part, so no leakage of the liquid phase should occur. In accordance with the present invention, during the melt solidification process, the C face of the crystal grows from the ends of a pair of the butted multi-core wire materials, like a bridge over both sides of a river, to compose filaments of a continuous C phase.

The superconductive joint method of the present invention may be applicable widely to superconducting appliances, for example, superconducting transmission cables, bus bars, long conductors, permanent current switch devices, large-scale magnets, nuclear magnetic resonance systems, medical MRI systems, superconducting power reserving systems, magnetic separation units, single-crystal drawing out systems in a magnetic field, freezer cooling superconducting magnet systems and the like, whereby the appliances can procure a higher efficiency and additionally, the loss of liquid helium can be reduced; the freezing potential for freezer cooling can be reduced; permanent current with a high-capacity and long-term stability can be realized if the method is applied to a permanent current switch. By using the present jointing technique, a great number of wire materials can be jointed together continuously, whereby an infinitely long wire material can be produced principally, which is then applicable to superconducting transmission cables and the like, to effectively reduce the loss occurring during power transmission between cities apart at a long distance.

The preferred embodiments are described as follows.

EMBODIMENT 1

A powder was preliminarily synthesized and prepared to a final molar stoichiometric ratio of Bi, Sr, Ca and Cu of 2:2:1:2. It was confirmed by powder X-ray diffraction that an almost absolute single-phase was produced, and thereafter, the powder was filled in a silver pipe to subject the powder to a process of preparing 19 and 55 multi-core wire materials; the resulting wire materials were molded in a tape shape.

Then, these multi-core tapes were cut into 40 to 100-mm pieces in the longitudinal direction. During cutting, additionally, special care was paid not to disorder the cross-sectional structure of the cut phase. It is important to thoroughly confirm whether the filaments of the multi-core wire materials are not damaged or the cut phase is flat. Samples with problems in these terms were subjected further to mechanical polishing or chemical polishing of the end parts, if necessary.

Figure 2:
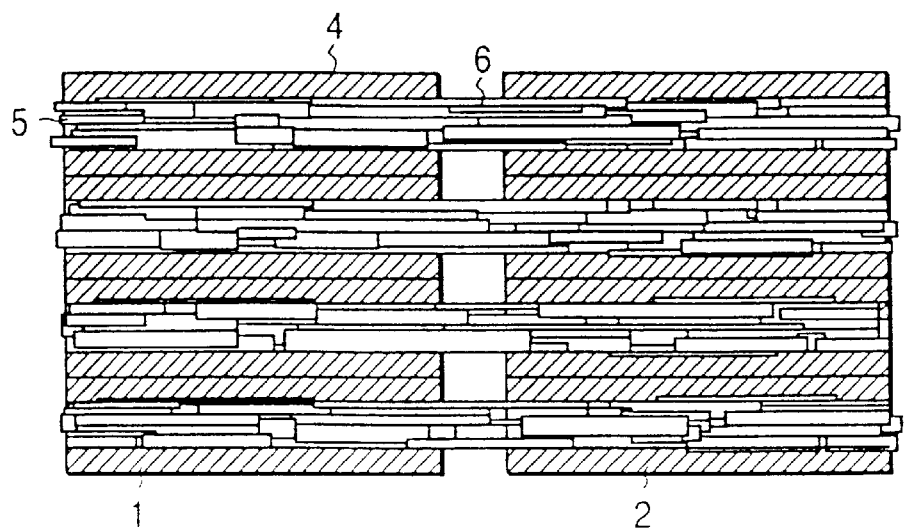
FIG. 2 is a schematic view of a joint part of the oxide superconductor wire material of the present invention.
Figure 3:
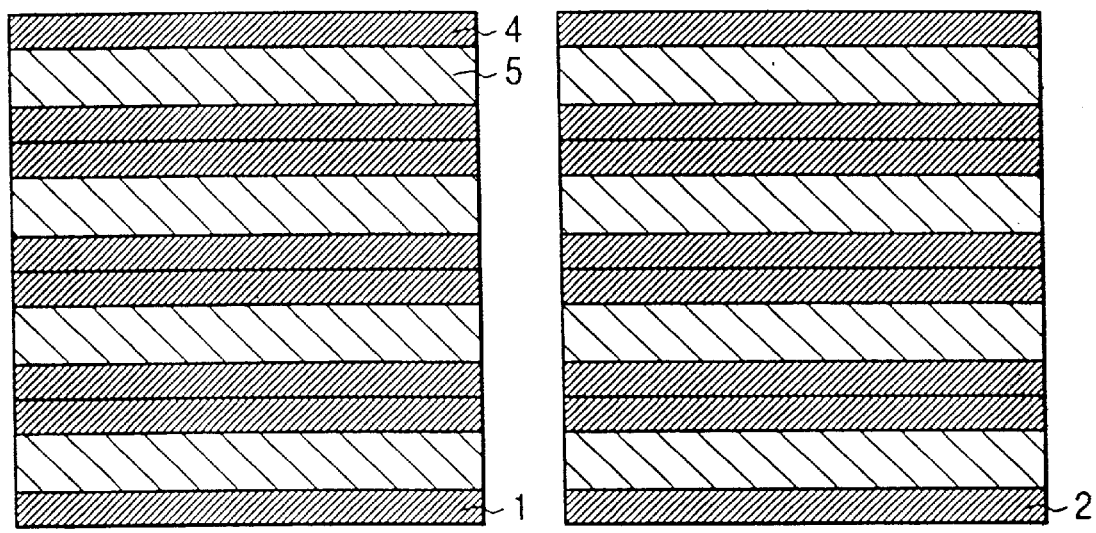
FIG. 3 is a cross-sectional view of the oxide superconductor wire material of the present invention.

As shown in FIG. 1, then, the multi-core wire materials 1, 2 prepared as a pair were butted to each other, by utilizing the upper face of tape 3 of the same material. Herein, silver was used in sheathing material 4, while 19 or 55-core superconductor filament 5 was used. The wire materials were partially melted and thermally processed within a temperature range of 860° C. to 900° C. in an oxidizing atmosphere (for example, 880° C., for 15 minutes, 100% oxygen atmosphere), followed by annealing. The possible thermal conditions are 800° C. to 900° C., for 5 minutes to 60 minutes. The possible atmosphere conditions is 10~100% oxygen. The microfine structure of the joint part after such thermal treatment is shown schematically in FIG. 2. Herein, only the proximity of the joint part 6 is enlarged as shown. Through granule growth and orientation via melt solidification, superconductor filament 5 coated with the sheathing material 4 turns into a dense matrix. If the interval between the wire materials 1 and 2 is sufficiently close (not more than 100 $\mu$m is preferable) at the joint part 6, furthermore, the crystals growing toward the center from the right and left wire material ends are attached together as regards the individual filaments, to continuously form the C axis. For comparison, the appearance of the cross section of the sample prior to thermal treatment is shown schematically in FIG. 3. In the figure, the oxide superconductor is in a pulverized and dense matrix through mechanical processing (for example, rolling or wire drawing). By partially melting and thermally treating the sample, a joint structure with the cross-sectional shape as shown in FIG. 2 is produced. If such jointing is realized, the critical current at the joint part in liquid helium is 450 A with a critical current density of 4500 A/mm$^2$ per cross section of the superconductor. Consequently, the critical current density at the joint part is almost the same as the density value of the superconducting wire material itself.

EMBODIMENT 2

Figure 4:
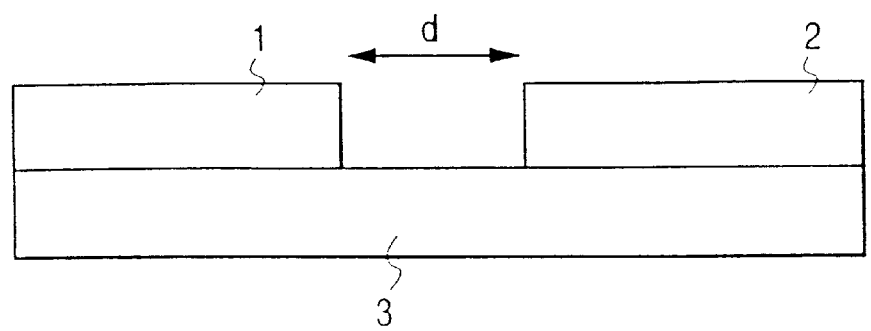
FIG. 4 is a schematic view of the joint part of the oxide superconductor wire material of the present invention.
Figure 5:
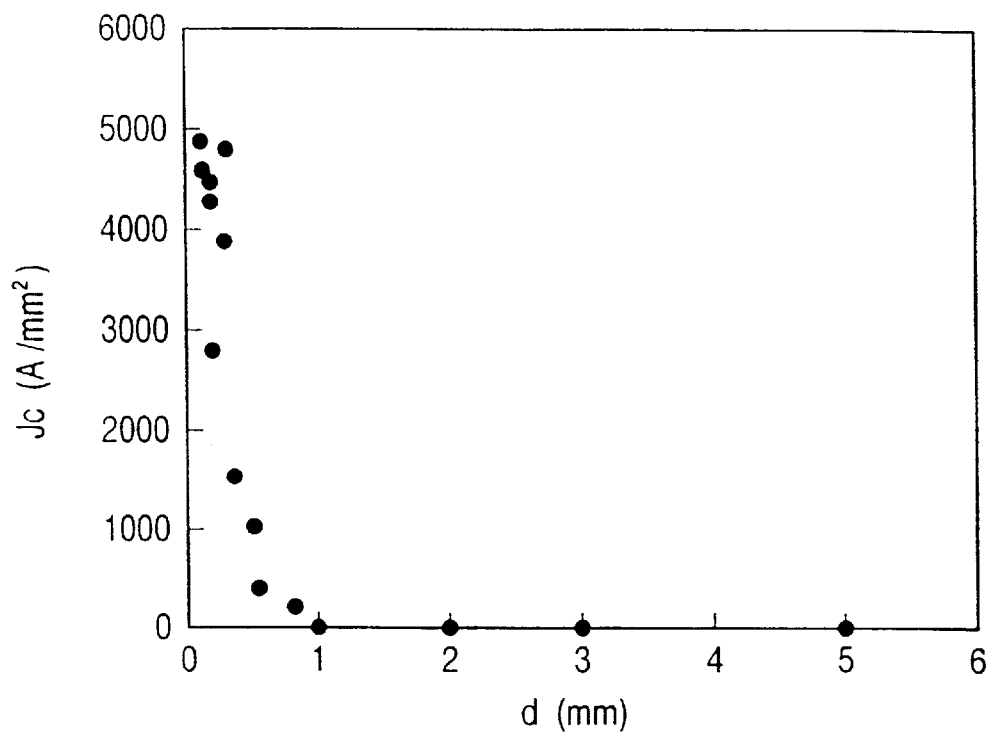
FIG. 5 is a characteristic chart of the oxide superconductor wire material of the present invention.

A wire material of a tape shape was prepared in the same manner as in Example 1. Subsequently, a joint part as schematically shown in FIG. 4 was prepared and partially melted and thermally treated in the same manner. Joint distance "d" is provided between wire materials 1 and 2, and by using the "d" as a parameter, the relation between the critical current density and the "d" was examined. The results are shown in FIG. 5. The figure indicates that the jointing distance "d" up to about 0.25 mm does not cause almost any reduction of the critical current density so good jointing can be maintained; and that a higher current density of 1000 A/mm$^2$ or more can be maintained although the current is slightly reduced at about 0.4 mm. In accordance with the present invention, the ends of the multi-core tape wire materials are butted to each other followed by partial melting and thermal treatment to effect jointing thereof. With respect to the process, effectively, the distance between the butted parts should be approximately zero, but practically, the distance physically possible is under constraint, which involves a distance gap. It is indicated from the relation shown in FIG. 5 that the gap is preferably within 0.4 mm, more preferably within 0.2 mm.

EMBODIMENT 3

Figure 6:
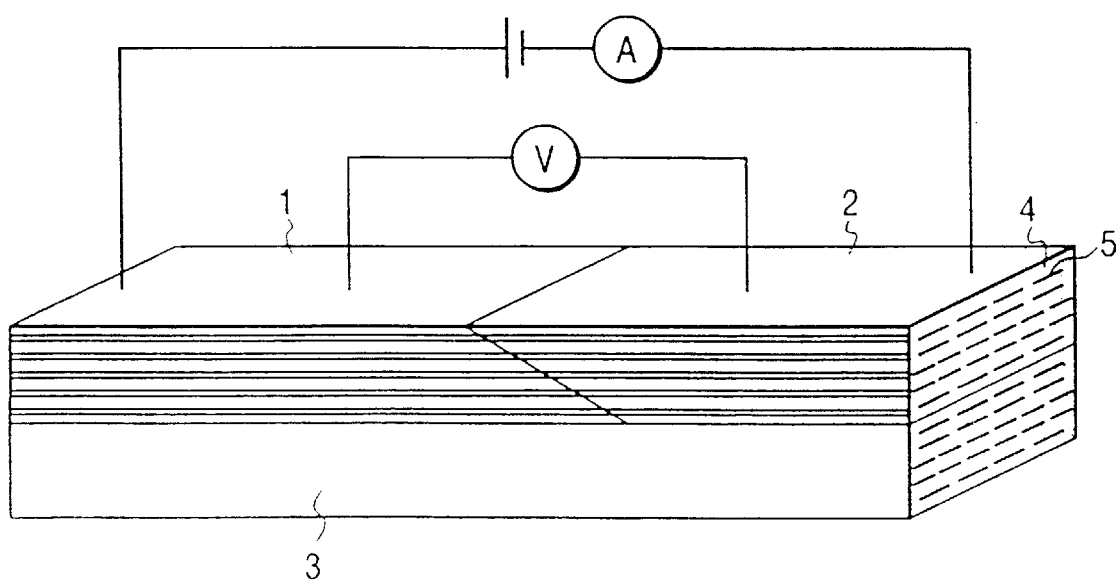
FIG. 6 is a schematic view of the oxide superconductor wire material of the present invention.
Figure 7:
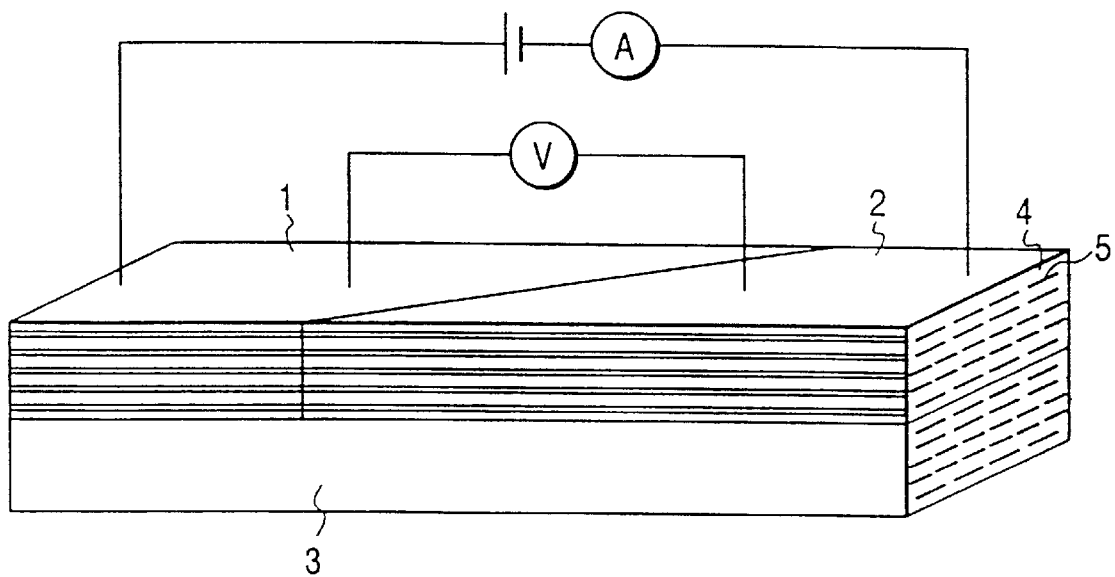
FIG. 7 is a schematic view of the oxide superconductor wire material of the present invention.
Figure 8:
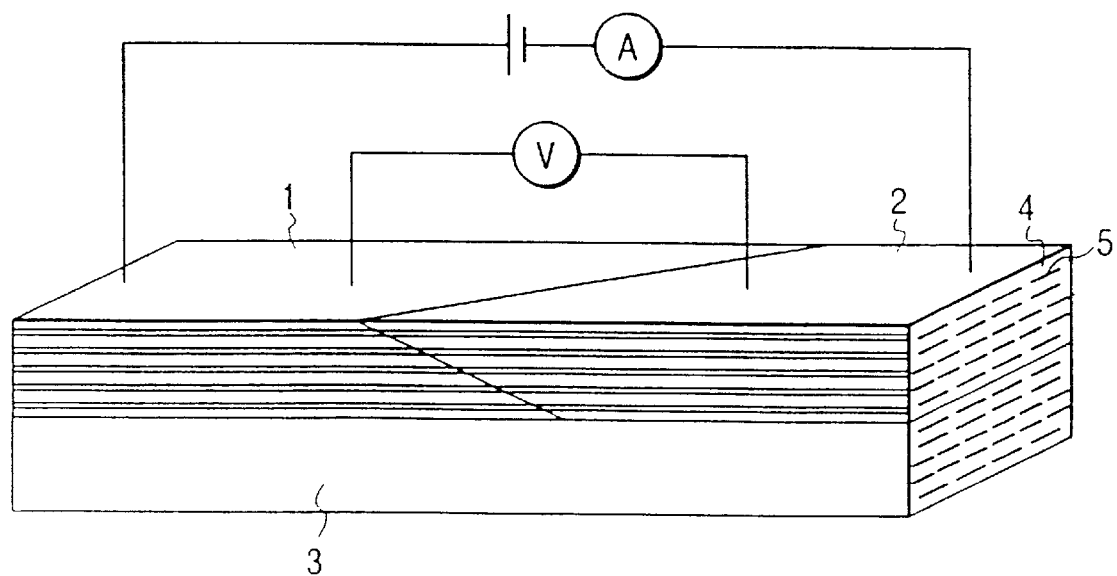
FIG. 8 is a schematic view of the oxide superconductor wire material of the present invention.

Mechanical or thermal distortion is likely to be concentrated on the joint part of tape wire materials. When tensile distortion is applied to the part in the longitudinal direction, in particular, cracking and the like readily occur, which potentially deteriorate the properties. FIGS. 6, 7 and 8 depict examples of methods for preventing such deterioration of the properties. In any of the examples, the jointing end face shown in FIG. 1 is arranged at an angle to the wire material longitudinal direction, whereby stress concentration is reduced. After 10 cycles of a heat cycle composed of liquid helium temperature and room temperature were repeated, Jc was 0.75 in the sample of FIG. 1, compared with the Jc prior to the heat cycle; Jc was 0.82 in FIG. 6 and 1.0 in FIGS. 7 and 8, with no deterioration observed.

EMBODIMENT 4

Figure 9:
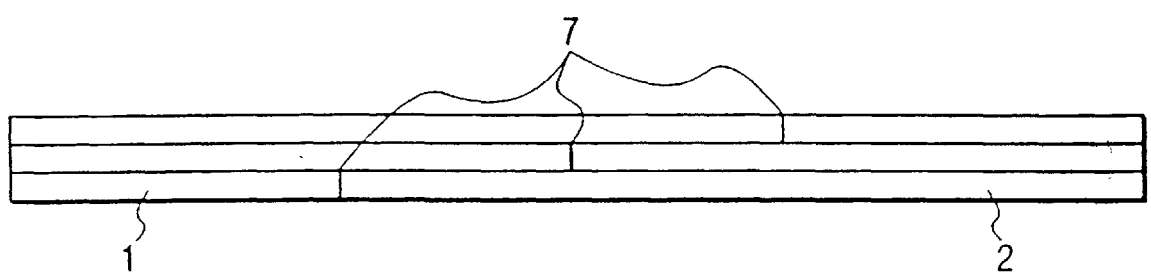
FIG. 9 is a schematic view of a joint part of the oxide superconductor wire material of the present invention.
Figure 10:
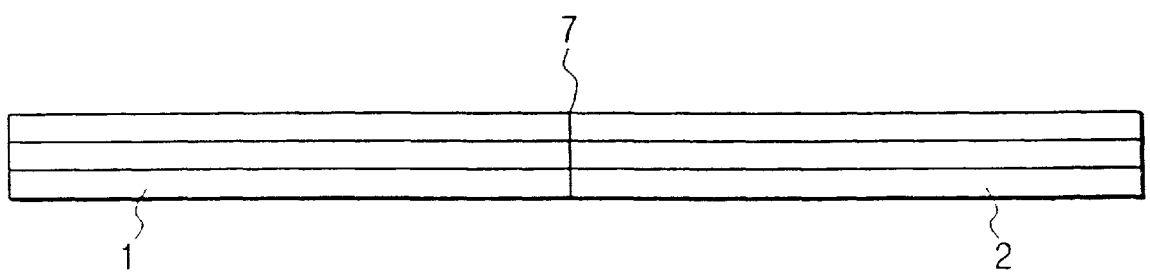
FIG. 10 is a schematic view of a joint part of the oxide superconductor wire material of the present invention.

FIGS. 9 and 10 show one example of a plurality of tape wire materials in lamination. Both of the figures depict a schematic view of the laminated tape at a state when observed from a side face. In FIG. 9, joint portions 7,7 are shifted between the upper and lower tapes. Alternatively, in FIG. 10, three such tapes are jointed together at the same position. The structure of FIG. 10 is mechanically weak under the distortion along the wire material longitudinal direction, and when partially melted, the liquid components in the upper and lower tapes are mixed together to reduce the orientation at the joint part. On the contrary, as shown in FIG. 9, alternate jointing of a plurality of tapes can reduce mechanical distortion and additionally can elevate the orientation of the crystal, with the resultant increase of Jc. After 10 cycles of a heat cycle of liquid helium temperature and room temperature, Jc is markedly reduced as low as 0.3 in FIG. 10, compared with the sample of FIG. 9 having Jc of 1; and the critical current prior to the heat cycle was 270 A in the sample of FIG. 10 while the current in the sample of FIG. 9 was 1200 A.

EMBODIMENT 5

Figure 11:
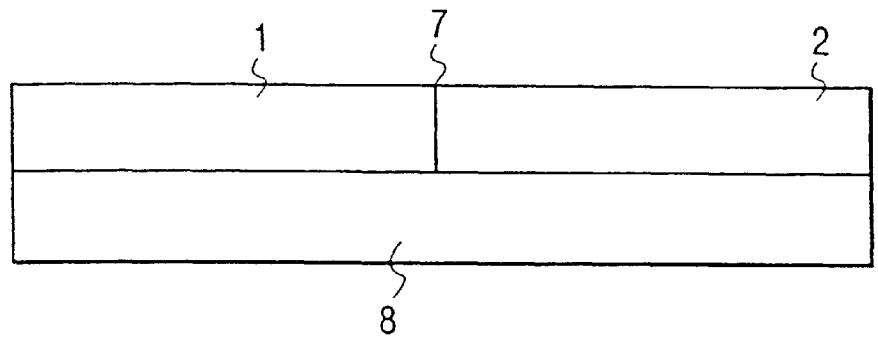
FIG. 11 is a schematic view of a joint part of the oxide superconductor wire material of the present invention.

FIG. 11 depicts one example of jointing a multi-core tape wire material with different sheath materials. The wire materials were prepared in the same manner as in Example 1. In the example, two types of the sheath materials for the superconductor were used; namely, silver 1 and silver-10 wt % gold alloy 2. Jointing with such metal sheaths of different metals is used for jointing, for example, a superconducting magnet with permanent current switch, a superconducting transmission cable with superconducting current limiting unit, a superconducting trance or superconducting current lead or the like. The reason lies in that because the sheath material in the alloy sheath has a larger electric resistance and a smaller electric conductivity, the material is more excellent for a superconducting current limiting unit, a superconducting trance, a superconducting current lead, a superconducting permanent current switch and the like than silver. The magnet operation of permanent current can be realized, which has never been attained in conventional oxide superconductors. Preferably, the content of gold is about 10% by weight, but gold may be used in a wide range of 1% to 20%. In FIG. 6, the silver-10 wt % gold alloy sheath tape is arranged as shown in the figure, which is then partially melted and thermally treated in the same manner as in Example 1. Herein, the oxide superconductor in the silver-10 wt % gold alloy sheath tape has a melting point higher by about 10° C. than that in the silver sheath. Due to the difference in melting temperature between the two sheaths, good jointing through partial melting can hardly be procured. So as to overcome the phenomenon, thus, a trace amount of silver powder should preferably be added to the Bi-2212 powder filled in the silver-10 wt % gold alloy sheath tape. Preferably, the silver particle size is about 1 to 10 microns, and the particle may be added in the form of metal or silver oxide, satisfactorily. Additionally, the particles should be added preferably at 0.01% or more to 10% or less by weight, more preferably 0.1% or more to 1% or less by weight, to the Bi-2212. If the silver is added at a too low level, the effect cannot be exhibited; if the silver is added at a too high level, the effect is exerted insufficiently, which adversely blocks the superconducting current pass disadvantageously. The optimum level of the silver to be added should be selected, depending on the sheath material; for silver-10 wt % gold alloy, for example, silver may preferably be added at about 0.5%. At any variation of silver distribution, furthermore, the melt temperature readily changes. Therefore, the alloy should be mixed together sufficiently homogeneously (for example, by ball-mill).

As the metal coating material of the wire material, use may be made of alloys produced by finely dispersing magnesium, nickel, aluminum or oxides of two or more thereof in silver or silver-gold alloy as the mother material. By utilizing such alloys (the oxides of 0.1 µm~100 µm in diameter and 0.1%~5% weight of the mother material are finely dispersed into the mother material), the mechanical strength of the wire material and a device composing the system can be elevated.

COMPARATIVE EXAMPLE 1

Figure 12:
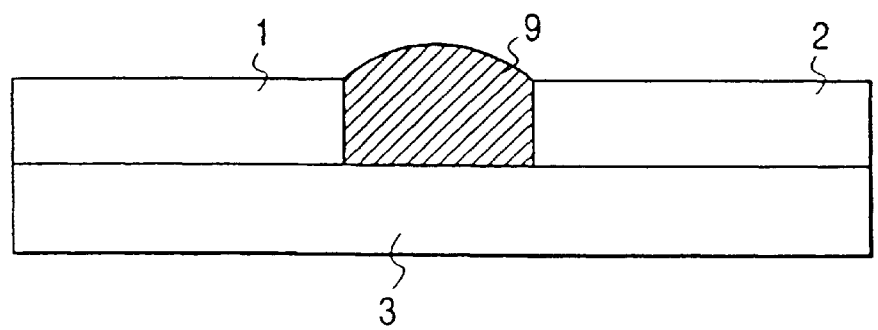
FIG. 12 is a schematic view of a joint part of the oxide superconductor wire material of the comparative example of the present invention.
Figure 13:
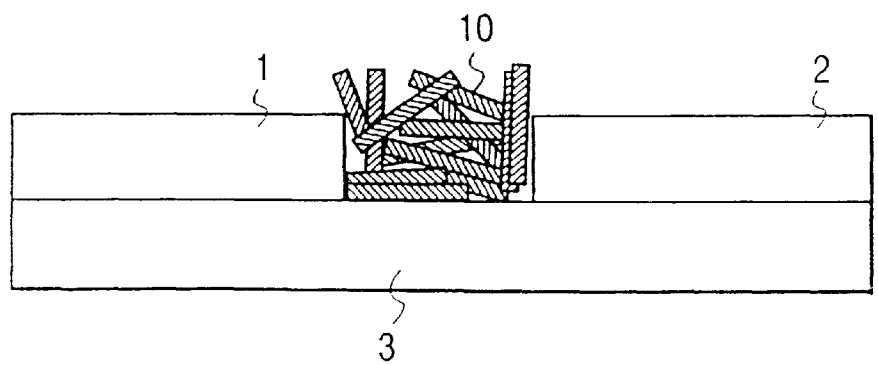
FIG. 13 is a schematic view of a joint part of the oxide superconductor wire material of the comparative example of the present invention.

FIGS. 12 and 13 show Comparative Examples. In the figures, silver sheath multi-core wire materials 1 and 2 are jointed together on silver sheath tape wire material 3 in a similar manner to that in Example 1, but filling material 9 is inserted between the wire materials 1 and 2. Herein, a Bi-2212 calcined powder of a stoichiometric composition was used in the wire materials 1, 2, 3 and the filling material 9. Furthermore, the interval between the wire materials 1 and 2 was 0.5 mm. FIG. 13 schematically depicts the results of partially melting and thermally processing the sample. As apparently shown in the figure, dense filling material 10 was produced by melt solidification, but the orientation thereof was severely poor. The critical current of the sample was 60 A; and the critical current density was 670 A/mm$^2$.

Figure 14:
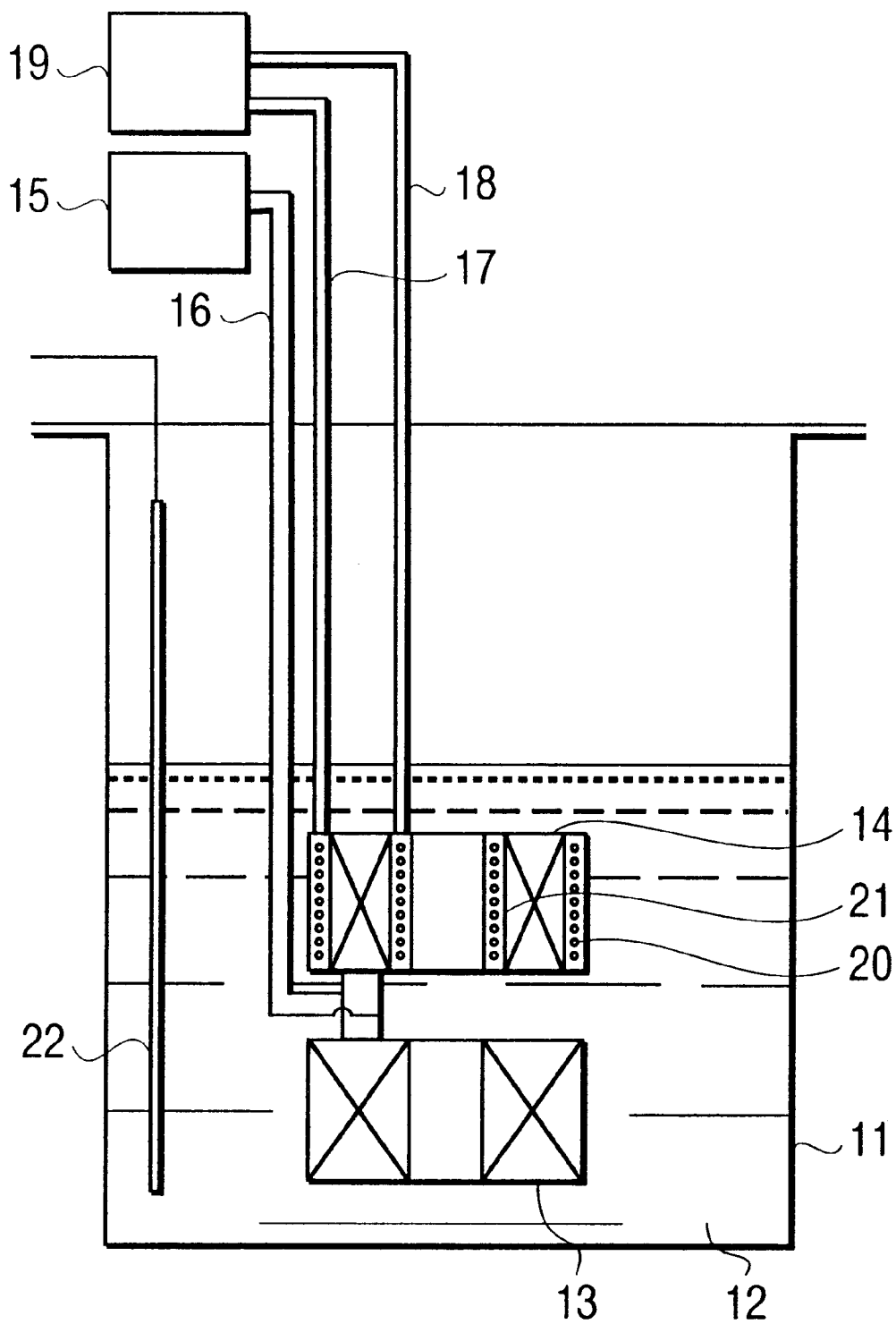
FIG. 14 is a schematic view of a superconducting magnet system of the present invention.

FIG. 14 shows a schematic structure of a superconducting magnet system of the present invention.

A superconducting magnet 13 and a persistent current switching element 14 are dipped in liquid helium 12 contained in a cryostat 11. The superconducting magnet 13 and the persistent current switching element 14 are connected by a connection part made of a superconductive wire, which can have a superconductive structure of the present invention as described in this specification. Further, the connection part, and a source for coil excitation 15 provided outside of the cryostat 11, are connected via current leads 16 for a coil. At the persistent current switching element 14, heaters 20 and 21 for heating a persistent current switch, connected to a source for heating 19 via current leads 17 and 18 for heaters, are provided. And, a liquid helium surface level detector 22 is provided in the cryostat 11.

By the invention, a high-capacity jointing of a multi-core wire material of an oxide superconductor material can be attained, which enables current pass at a critical current density of 1000 A/mm$^2$ or less and a critical current of 300 to 500 A. Additionally, the magnet operation of permanent current is realized, which has never been achieved by conventional oxide superconductors. A superconducting connection between a permanent current switch and superconducting coil can be achieved, so the magnet operation of permanent current is realized.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A metal-coated multi-core oxide superconductor wire material of a flat cross-sectional shape, having at least two wire structures each extending in a longitudinal direction and having an oxide superconductor crystal with a C axis, two of the wire structures forming a joint part therebetween, wherein the C axis of the oxide superconductor crystals of the two wire structures forming the jointed part are substantially oriented in the longitudinal direction of the wire material, and end faces of the two wire structures forming the jointed part, in the longitudinal direction, are in contact with each other, and the C faces of the oxide superconductor crystals of the two wire structures forming the jointed part are continuously oriented, at the joint part of the wire material.

2. An oxide superconductor wire material according to claim 1, wherein the oxide superconductor wire material is of a tape shape, and the end faces of the two wire structures are perpendicular to the longitudinal direction if observed from upper faces of the two wire structures.

3. An oxide superconductor wire material according to claim 1, wherein the oxide superconductor wire material is of a tape shape, and the end faces of the two wire structures are at an angle to the longitudinal direction if observed from upper faces of the two wire structures.

4. An oxide superconductor wire material according to claim 1, wherein the oxide superconductor wire material is of a tape shape, and the end faces of the two wire structures are at an angle to the longitudinal direction if observed from side faces of the two wire structures.

5. An oxide superconductor wire material according to claim 1, wherein the oxide superconductor wire material is of a tape shape, and the end faces of the two wire structures are at an angle to the longitudinal direction if observed from side and upper faces of the two wire structures.

6. An oxide superconductor wire material according to claim 1, wherein the thickness of an element wire of the oxide superconductor wire material is 0.1 mm to 0.3 mm.

7. An oxide superconductor wire material according to claim 1, wherein the wire material includes a metal coating, and wherein material of the metal coating is silver or silver-gold alloy or an alloy produced by finely dispersing magnesium, nickel, aluminum or oxides of two or more thereof in silver or silver-gold alloy.

8. An oxide superconductor wire material according to claim 1, wherein the oxide superconductor wire material is of a $Bi_2Sr_2Ca_2Cu_1O_x$ phase.

9. A superconducting magnet system comprising a persistent current switching element, a superconducting magnet, and a connection part therebetween, wherein said connection part is made of an oxide superconductor wire material according to claim 1.

10. A superconducting magnet system according to claim 9, further comprising a cryostat, and wherein the superconducting magnet and the persistent current switching element are positioned in the cryostat such that the superconducting magnet and the persistent current switching element can be immersed in liquid helium in the cryostat.

11. A multi-core superconducting wire material with a superconductive joint part, wherein critical current density is at least 1000 A/mm$^2$ and critical current is at least 100 A at the superconductive joint part.

12. A superconducting wire material according to claim 11, wherein the superconductive joint part is provided between two superconductors of oxide superconductor material.

13. A superconducting wire material according to claim 11, wherein the wire material is of a tape shape, and end faces of respective superconductor wire structures, forming the superconductive joint part, are perpendicular to a longitudinal direction in which the wire material extends, if observed from upper faces of the respective superconductor wire structures.

14. A superconducting wire material according to claim 11, wherein the wire material is of a tape shape, and end faces of respective superconductor wire structures, forming the superconductive joint part, are at an angle to a longitudinal direction in which the wire material extends, if observed from upper faces of the respective superconductor wire structures.

15. A superconducting wire material according to claim 11, wherein the wire material is of a tape shape, and end faces of respective superconductor wire structures, forming the superconductive joint part, are at an angle to a longitudinal direction in which the wire material extends, if observed from side faces of the respective semiconductor wire structures.

16. A superconducting wire material according to claim 11, wherein the wire material is of a tape shape, and end faces of respective superconductor wire structures, forming the superconductive joint part, are at an angle to a longitudinal direction in which the wire material extends, if observed from side and upper faces of the respective superconductor wire structures.

17. A superconducting wire material according to claim 11, wherein the thickness of an element wire of the wire material is 0.1 mm to 0.3 mm.

18. A superconducting wire material according to claim 11, wherein the wire material includes a metal coating, and wherein material of the metal coating is silver or silver-gold alloy or an alloy produced by finely dispersing magnesium, nickel, aluminum or oxides of two or more thereof in silver or silver-gold alloy.

19. A superconducting wire material according to claim 11, wherein the superconductive joint part is provided between two oxide superconductors of $Bi_2Sr_2Ca_2Cu_1O_x$ phase.

20. A superconducting magnet system comprising a persistent current switching element, a superconducting magnet, and a connection part therebetween, wherein said connection part is made of a superconducting wire material according to claim 11.

21. A superconducting magnet system according to claim 20, further comprising a cryostat, and wherein the superconducting magnet and the persistent current switching element are positioned in the cryostat such that the superconducting magnet and the persistent current switching element can be immersed in liquid helium in the cryostat.

* * * * *